(12) United States Patent
Yang

(10) Patent No.: US 6,468,872 B1
(45) Date of Patent: Oct. 22, 2002

(54) METHOD OF FABRICATING A THIN FILM TRANSISTOR

(75) Inventor: Joon-Young Yang, Seoul (KR)

(73) Assignee: L.G. Philips LCD Co., Ltd, Seoul (KR)

( * ) Notice: Subject to any disclaimer, the term of this patent is extended or adjusted under 35 U.S.C. 154(b) by 55 days.

(21) Appl. No.: 09/637,610

(22) Filed: Aug. 11, 2000

(30) Foreign Application Priority Data

Aug. 12, 1999 (KR) .............................. 99-33057

(51) Int. Cl.[7] .................... H01L 21/20; H01L 21/00
(52) U.S. Cl. .................... 438/384; 438/154; 438/143; 438/150; 438/471; 438/473
(58) Field of Search ................ 438/384, 143, 438/154, 473, 471, 142, 149, 150, 151

(56) References Cited

U.S. PATENT DOCUMENTS

| | | | | |
|---|---|---|---|---|
| 5,591,988 A | * | 1/1997 | Arai et al. ................. | 257/59 |
| 5,712,495 A | * | 1/1998 | Suzawa ....................... | 257/51 |
| 5,904,509 A | * | 5/1999 | Zhang et al. ................ | 438/154 |
| 6,087,648 A | * | 7/2000 | Zhang et al. ................ | 257/72 |
| 6,133,620 A | * | 10/2000 | Uochi ......................... | 257/649 |
| 6,204,520 B1 | * | 3/2001 | Ha et al. ...................... | 257/72 |
| 6,251,712 B1 | * | 6/2001 | Tanaka et al. ............... | 438/143 |
| 6,337,232 B1 | * | 1/2002 | Kusumoto et al. ........... | 438/151 |

* cited by examiner

*Primary Examiner*—Matthew Smith
*Assistant Examiner*—Igwe U. Anya
(74) *Attorney, Agent, or Firm*—McKenna Long & Aldridge, LLP

(57) ABSTRACT

The present invention relates to a simplified method of fabricating a thin film transistor (TFT), including the steps of preparing a first conductive type TFT including a first semiconductor layer and a first gate electrode and a second conductive type TFT including a second semiconductor layer and a second gate electrode on a substrate; doping the first and second semiconductor layers with a first conductive type impurity using the first and second gate electrodes as a mask; forming a doping mask covering the first conductive type TFT; counter-doping the second semiconductor layer with a second conductive type impurity using the doping mask and the second gate electrode as masks; and forming a CMOS TFT by electrically connecting the first conductive type TFT to the second conductive type TFT.

2 Claims, 12 Drawing Sheets

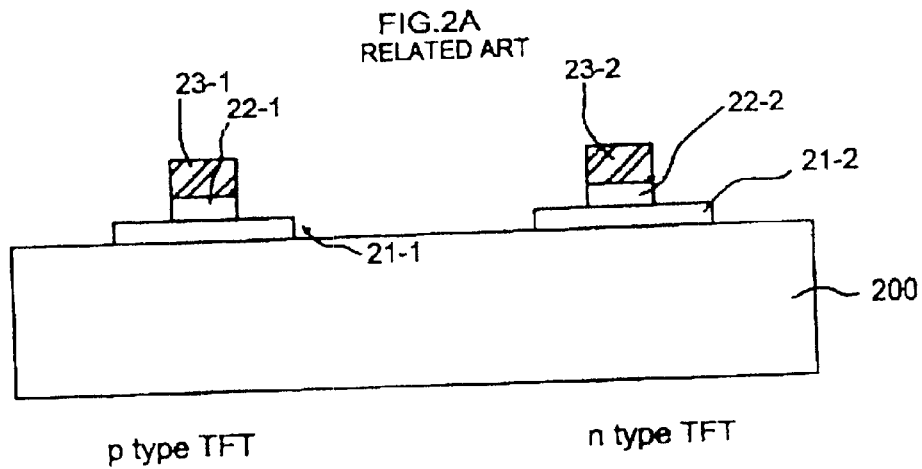
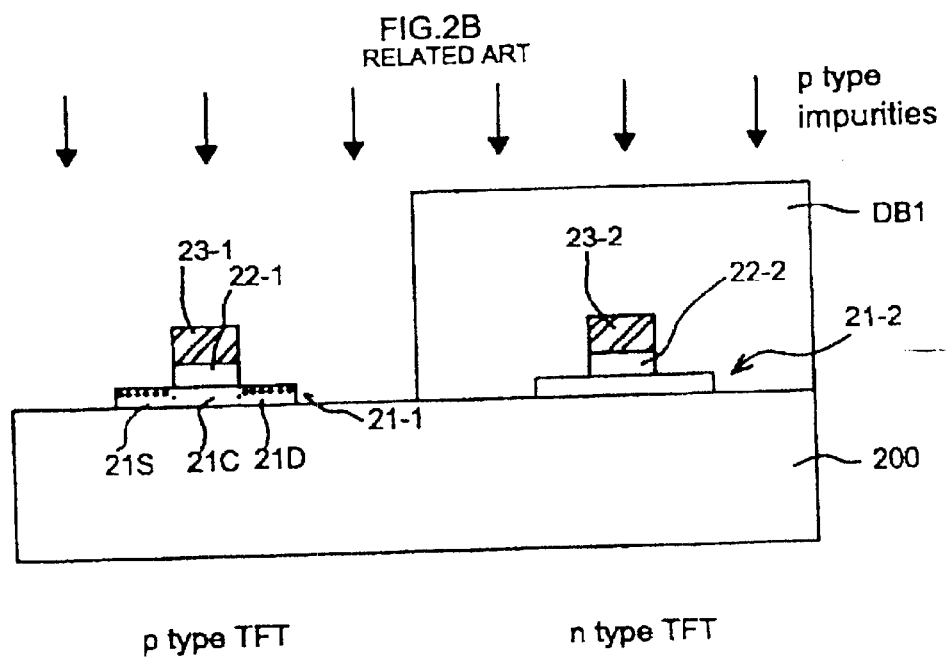

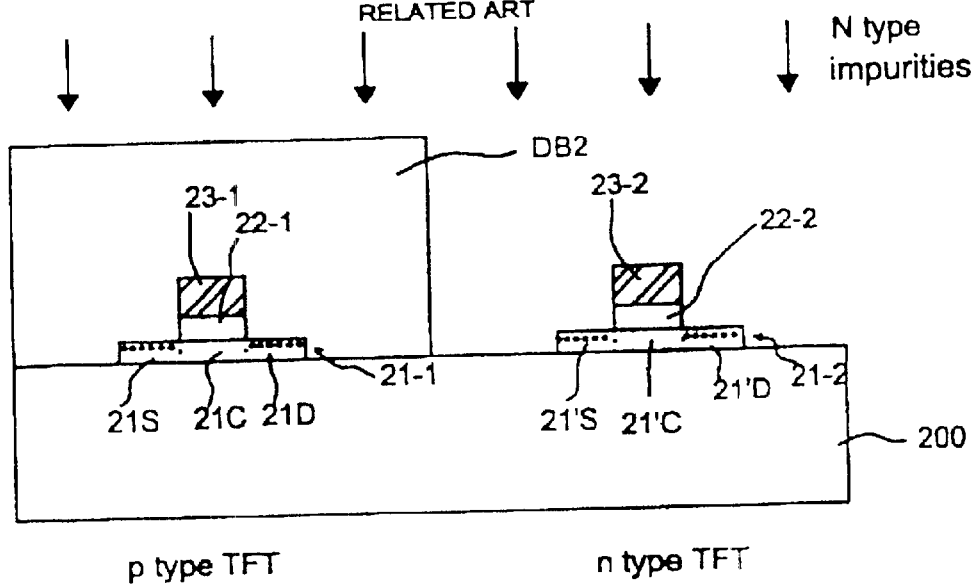
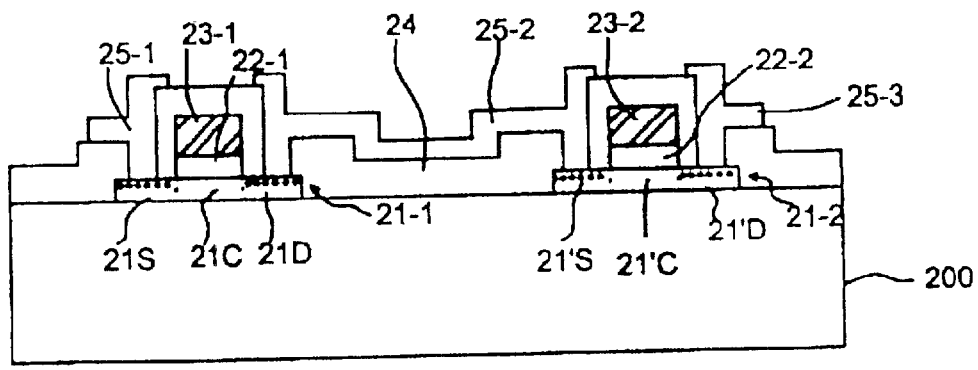

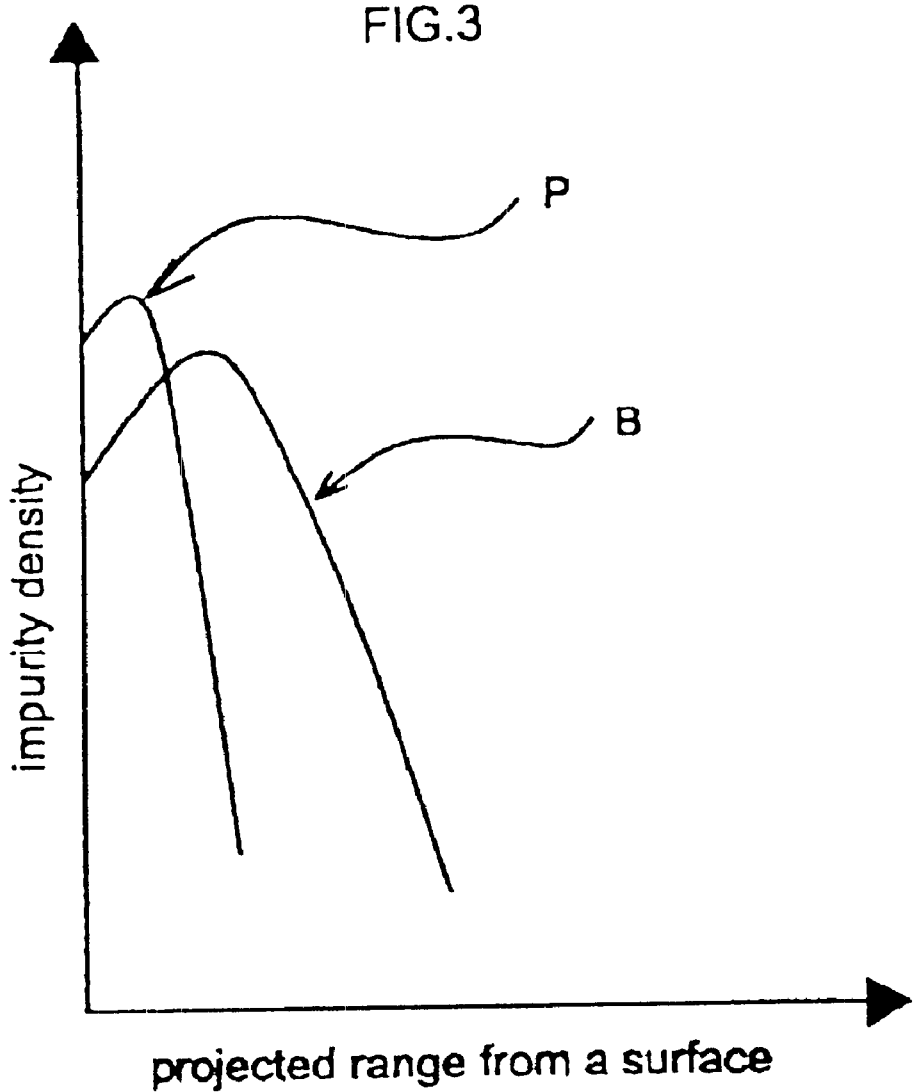

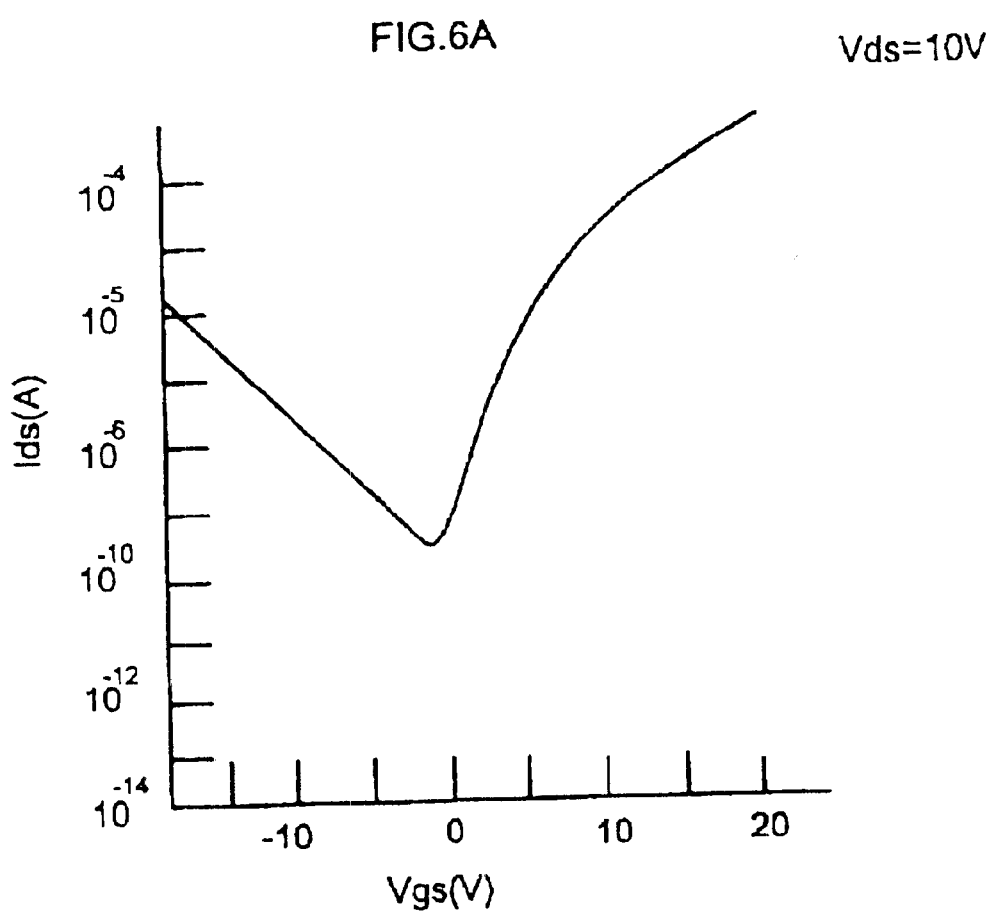

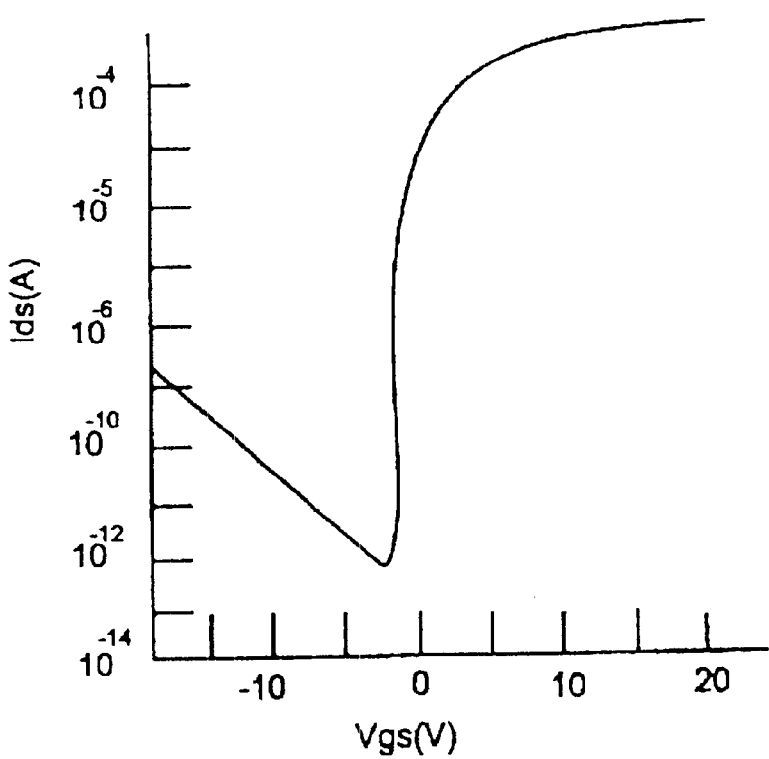

p type TFT    n type TFT p type TFT    n type TFT

METHOD OF FABRICATING A THIN FILM TRANSISTOR

This application claims the benefit of Korean Patent Application No. 1999-33057, filed on Aug. 12, 1999, which is hereby incorporated by reference.

BACKGROUND OF THE INVENTION

1. Field of the Invention

The present invention relates to a method of fabricating a thin film transistor (hereinafter "TFT"), and more particularly, to a method of fabricating TFTs which are used as switching devices in a liquid crystal display (hereinafter "LCD").

2. Discussion of the Related Art

An active layer of a TFT is formed of a semiconductor substance, having impurity-doped source and drain regions and an undoped channel region. A portion of the impurities of the source and drain regions are concentrated on the channel region by a signal applied to a gate electrode, thereby generating a path through which carriers migrate.

Impurity doping means that impurities, such as electric charges or molecules possessing energy, are implanted or injected into a semiconductor layer. The resulting layer is referred to as a "doped layer". Impurities, having been accelerated to have some kinetic energy 1 KV to multi MV, are directed to the surface of a semiconductor. The impurities enter into the crystals of the semiconductor, transferring the kinetic energy to the impacted crystal lattices. The impurities stop within the crystals at an averaged depth, called a projected range. The projected range in a given semiconductor may vary 100 Å to about 1 μm according to the impurity species and the projected energy.

As shown in FIG. 1, impurities are distributed symmetrically, with the distribution centering around the projected range Rp (hereinafter "RP"). The distribution of the injected impurities is Gaussian. As shown in FIG. 1, ΔRP designates a distribution deviation. RP and ΔRP are proportional to the impurity accelerating voltage.

FIG. 2A to FIG. 2D illustrate cross-sectional views of fabricating a coplanar CMOS TFT according to a related art.

Referring to FIG. 2A, areas where an n-type TFT and a p-type TFT will be formed are defined on a substrate 200. Semiconductor active layers 21-1 and 21-2 are formed on the respective areas of the substrate 200. Then, gate insulating layers 22-1 and 22-2 and gate electrodes 23-1 and 23-2 are formed on the semiconductor layers 21-1 and 21-2, respectively.

Referring to FIG. 2B, a first doping-blocking layer DB1 covering the n-type TFT area is formed. A source region 21S and a drain region 21D doped with p-type impurities are formed in the semiconductor layer 21-1 of the p-type TFT, thereby defining a channel region 21C. Channel region 21C remains undoped. The first doping-blocking layer DB1 is removed.

Referring to FIG. 2C, after the first doping-blocking layer DB1 has been removed, a second doping-blocking layer DB2 covering the p-type TFT area is formed. Then, a source region 21'S and a drain region 21'D doped with n-type impurities are formed in the other semiconductor layer 21-2 of the n-type TFT, thereby defining a channel region 21'C.

Referring to FIG. 2D, the second doping-blocking layer DB2 covering the p-type TFT area is removed. After an insulating layer 24 covering an entire top surface of the substrate 200 has been formed, contact holes exposing the source and drain regions 21S and 21D of the p-type TFT and the source and drain regions 21'S and 21'D of the n-type TFT are formed. Then, a CMOS TFT constructed with p- and n-type TFTs complementary to each other is fabricated by forming wires 25-1, 25-2, and 25-3 connecting the exposed source and drain regions 21S and 21D of the p-type TFT to the exposed source and drain regions 21'S and 21'D of an n-type TFT, respectively.

A disadvantage of the related art is the required use of the two doping-blocking layers, to dope p- and n-type TFTs with proper impurities respectively, as shown in FIGS. 2B and 2C. Therefore, two masks must be prepared to pattern the two doping-blocking layers, resulting in a complicated process and reducing its product yield.

SUMMARY OF THE INVENTION

Accordingly, the present invention is directed to a method of fabricating a thin film transistor ("TFT") that substantially obviates one or more of the problems due to limitations and disadvantages of the related art.

An object of the present invention is to provide a simplified method of fabricating a CMOS TFT by counter-doping using a single impurity doping mask.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof, as well as the appended drawings.

To achieve these and other advantages and in accordance with the purpose of the present invention, as embodied and broadly described, the present invention includes the steps of preparing a first conductive type TFT including a first semiconductor layer and a first gate electrode and a second conductive type TFT including a second semiconductor layer and a second gate electrode on a substrate; doping the first and second semiconductor layers with a first conductive type impurity using the first and second gate electrodes as masks; forming a doping mask covering the first conductive type TFT; counter-doping the second semiconductor layer with a second conductive type impurity using the doping mask and the second gate electrode as masks, and a step of forming CMOS TFT by connecting electrically and complementarily the first conductive type TFT to the second conductive type TFT.

Preferably, the first and second conductive types are p and n respectively, a dose of the second doping step is heavier than that of the first doping step, and accelerating voltage of the second doping step is higher than that of the first doping step.

Preferably, the first and second conductive types are n and p respectively and wherein a dose of the second doping step is heavier than that of the first doping step, and accelerating voltage of the second doping step is substantially the same as that of the first doping step.

It is to be understood that both the foregoing general description and the following detailed description are exemplary and explanatory and are intended to provide further explanation of the invention as claimed.

BRIEF DESCRIPTION OF THE DRAWING

The accompanying drawings, which are included to provide a further understanding of the invention and are incorporated in and constitute a part of this specification, illustrate embodiments of the invention and together with the description serve to explain the principles of the invention.

In the drawings:

FIGS. 2A to 2D show cross-sectional views of fabricating a coplanar CMOS-type TFT according to a related art;

FIG. 3 shows doping profiles of phosphorus and boron, respectively;

FIGS. 6A to 6D show transfer curves of n-type TFTs fabricated by n-type impurity counter-doping after p-type impurity doping.

DETAILED DESCRIPTION OF THE PREFERRED EMBODIMENTS

Reference will now be made in detail to the preferred embodiment of the present invention, example of which is illustrated in the accompanying drawings.

A TFT having excellent device characteristics is fabricated by the present invention using counter-doping. In counter-doping, a semiconductor layer previously doped with n (or p) type impurities, is doped with a p (or n) type impurities of a "counter-type". Thus, the conductivity of the impurity used in the latter doping becomes the final conductivity type of the TFT.

Even though n- and p-type impurities accelerated by the same voltage are implanted in a substrate, the doping profiles of the respective impurities differ in their characteristics. Thus, doping conditions can then be adjusted properly for the respective conductive types to form impurity regions by counter-doping.

FIG. 3 shows a graph of doping profiles of phosphorus and boron, respectively. The graph illustrates the result of a test in which accelerating voltage and doping density are compared. Referring to FIG. 3, when the same accelerating voltage and doping density are used for the test, a density peak value, that is RP, of boron is greater than that of phosphorus. In the test, the doping profile distribution of boron in a semiconductor layer has smoother density slope than phosphorus. The difference of doping profiles between phosphorus and boron allows boron to penetrate into the semiconductor layer more deeply than phosphorus at the same accelerating voltage as boron. Therefore, if a desired conductive type is realized only by counter-doping, the process condition is selected so that the counter-doping conductive type impurities can compensate for the previous conductive type impurities.

Figure 1:
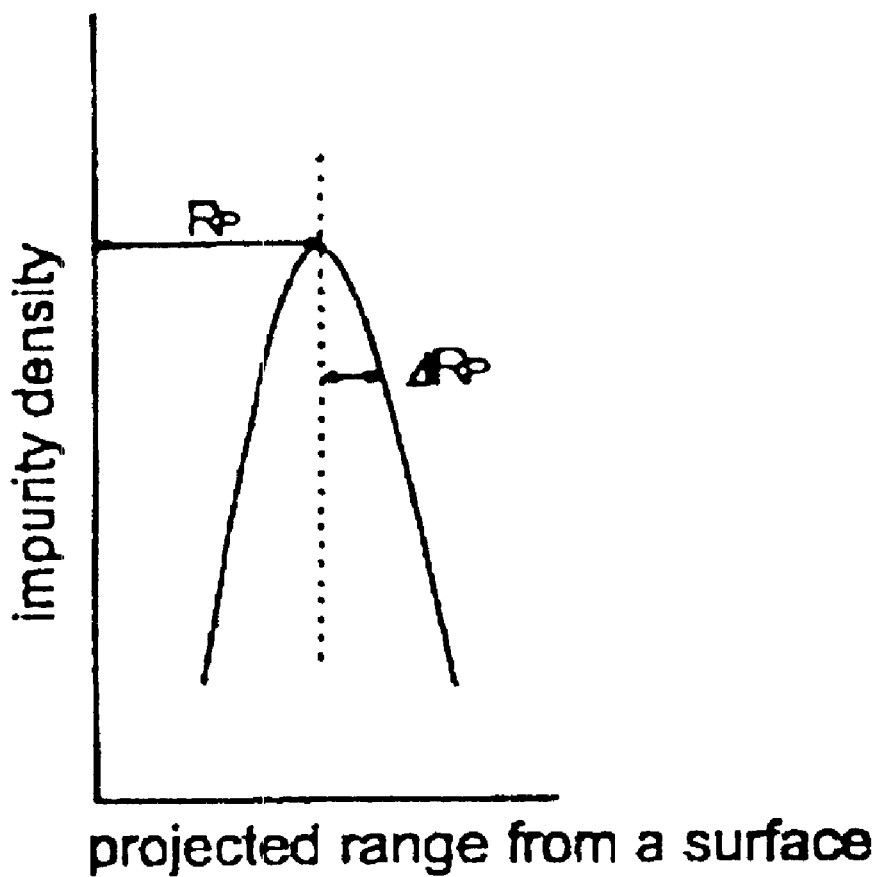
FIG. 1 shows a graph showing a Gaussian distribution of impurities.
Figure 4:
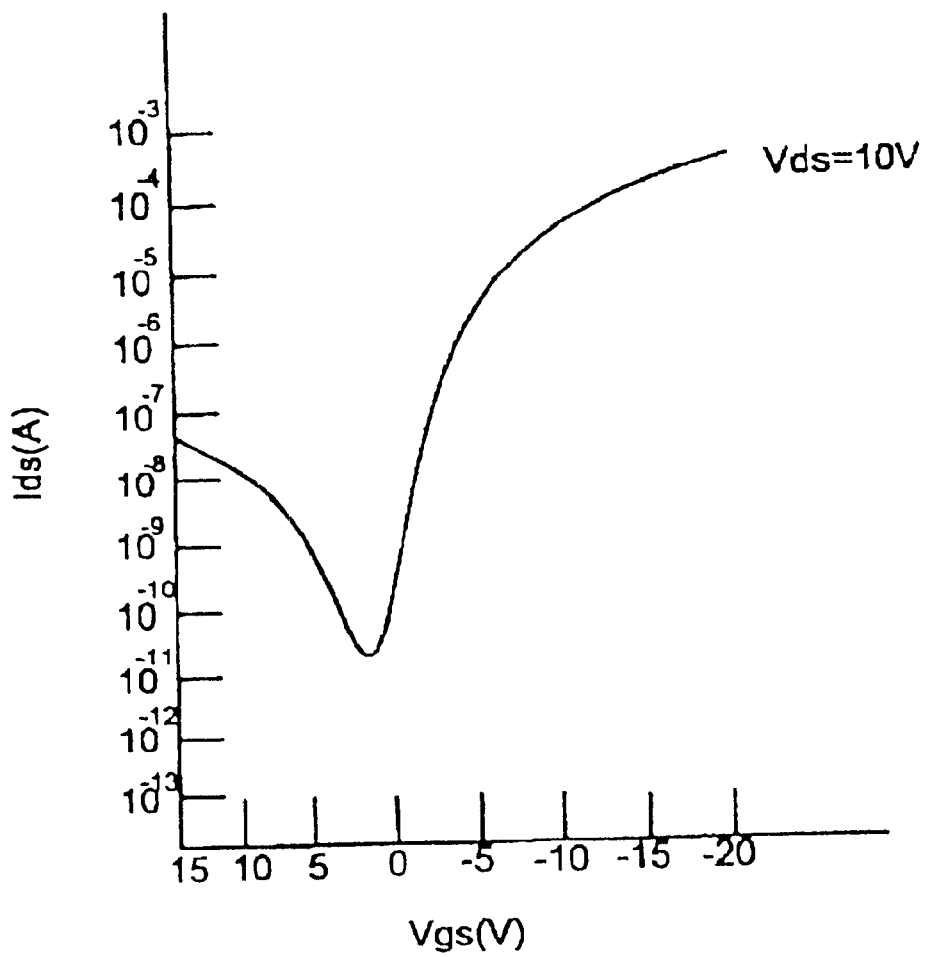
FIG. 4 shows a transfer curve of a p-type transistor counter-doped with p-type impurities after n-type impurity doping.

FIG. 4 shows a graph of a transfer curve of an n-doped p-type transistor counter-doped with p-type impurities. Referring to FIG. 4, a coplanar p-type TFT is fabricated by doping with phosphorus at a dose of $1\times10^{15}/cm^2$ and accelerated by the voltage of about 10 kV. Then the TFT is counter-doped with boron at a dose of $3\times10^{15}/cm^2$ and the same accelerating voltage. Thus, as shown in FIG. 4, the p-type TFT fabricated by the above method has improved on/off current characteristics.

After completing the n-type impurity doping, it is possible to fabricate the p-type TFT by counter-doping p-type impurities using the same accelerating voltage as that used for the n-type impurity doping, as shown in FIG. 3. Such counter-doping is possible because the density peak value of the p-type impurities is greater than the density peak value of the n-type impurities. Moreover, the p-type impurity has a smoother density slope. Therefore, when counter-doping is carried out by using a density of the p-type impurities greater than that of the n-type impurities, for example 2–3 times greater, the p-type impurities compensate for the n-type impurities, even when the same accelerating voltage is applied.

Counter-doping is used to fabricate a reliable p-type TFT by n-type impurity doping followed by p-type impurity counter-doping by setting the p-type impurity density to compensate for the n-type impurities at the same accelerating voltage. Because of the different doping profile characteristics of the n- and p-type impurities, the above doping condition cannot be applied to fabricate a reliable n-type TFT by p-type impurity doping followed by n-type impurity counter-doping. A process for fabricating an n-type TFT by p-type impurity doping followed by n-type impurity counter-doping will be explained in the following description by referring to the drawings.

The remaining figures show characteristics of doping profiles and an n-type TFT fabricated by p-type impurity doping followed by n-type impurity counter-doping.

FIGS. 5A to 5D show graphs of doping profiles of boron and phosphorus after p-type impurity doping followed by n-type counter-doping, according to accelerating voltages 10 kV, 30 kV, 50 kV, 60 kV, respectively. FIGS. 6A to 6D show graphs of transfer curves of n-type TFTs fabricated by p-type impurity doping followed by n-type impurity counter-doping. After source/drain regions of an active layer formed of polysilicon have been doped with boron at a dose of $1\times10^{15}/cm^2$ and voltage of 10 kV, the boron impurity is successively compensated for by doping the active layer with phosphorus at a dose of $3\times10^{15}/cm^2$ and the voltage of 10, 30, 50, and 60 kV, respectively. Activation after the completion of impurity doping is carried out by an excimer laser of 180 mJ/cm$^2$.

Referring to FIG. 6A, when an n-type TFT is fabricated by counter-doping with phosphorus having the same accelerating voltage as boron, 10 kV, the off-current becomes over $10^{-6}$, if the source/drain voltage and the gate voltage are 10V and 15V, respectively. This result can be inferred from SIMS analysis shown in FIG. 5A. Namely, boron is implanted deeper than phosphorus when the accelerating voltage of phosphorus is substantially the same as that of boron, and the phosphorus only partially compensates for the boron. Thus, leakage current results from insufficient compensation.

Figure 5A:
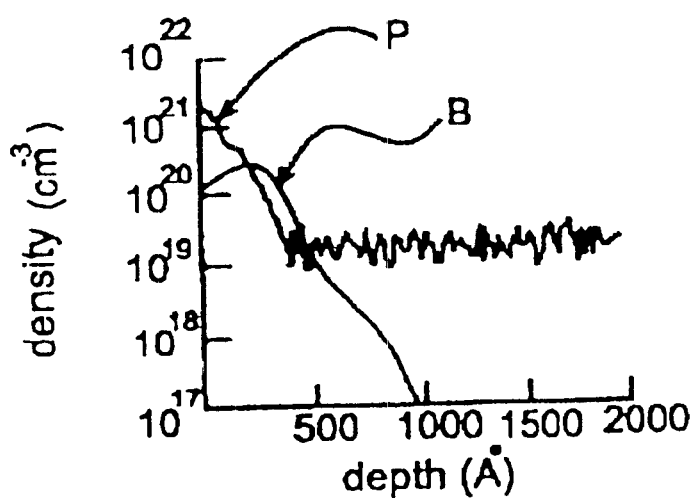
FIGS. 5A to 5D show doping profiles of boron and phosphorus according to accelerating voltage when n-type impurities are counter-doped after p-type impurity doping.
Figure 5B:
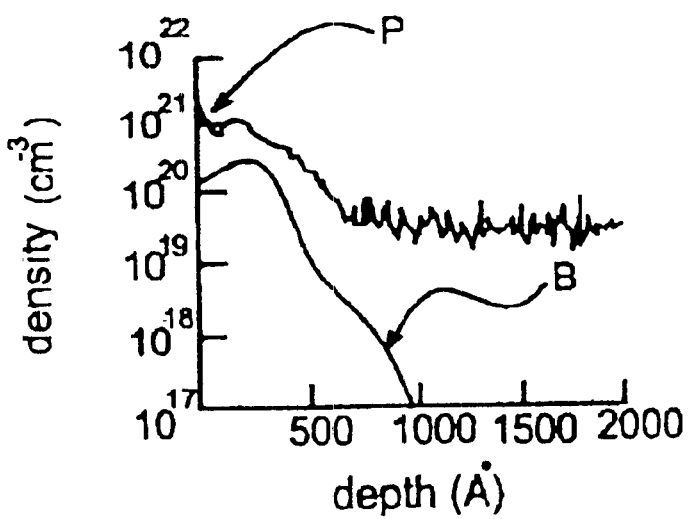
Figure 5C:
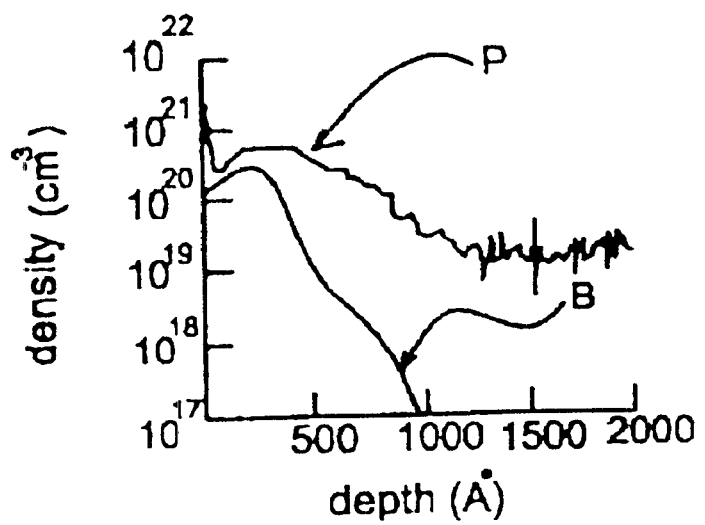
Figure 5D:
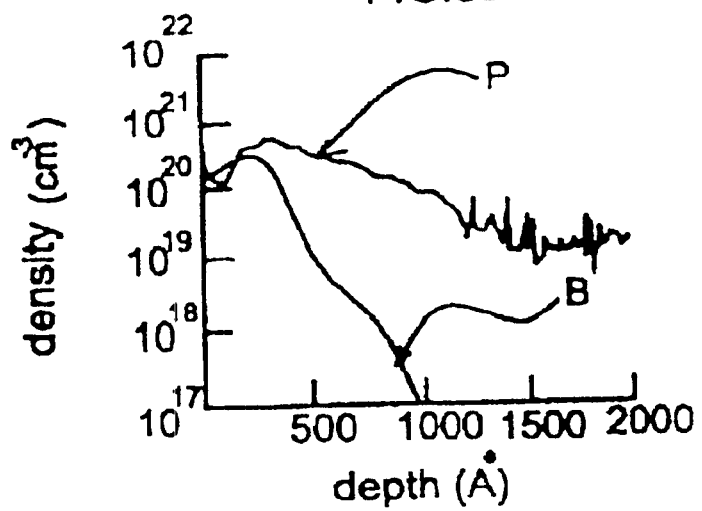
Figure 6C:
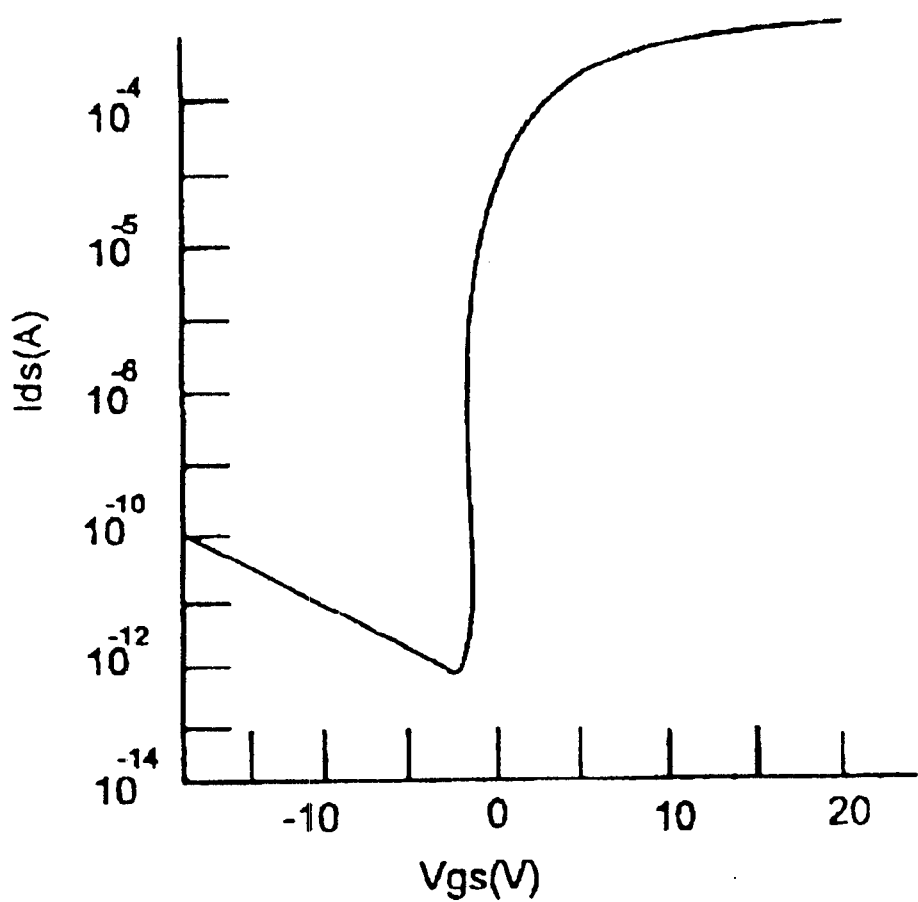

As shown in FIG. 5B and FIG. 5C, sufficient compensation is achieved by applying the accelerating voltage of 30–50 kV of phosphorus, according to the SIMS analysis. As a result of the test, the off-current is reduced as the accelerating voltage of phosphorus is increased to 50 kV. As shown in FIG. 6D, the off-current increases as the accelerating voltage increases above 50 kV. When the accelerating voltage is over 50 kV, the off-current increases because phosphorus is implanted too deeply to compensate for the boron. Thus, the compensation between phosphorus and boron is inverted.

Significantly, a reliable p-type TFT can be fabricated by counter-doping even though the accelerating voltage of phosphorus is adjusted to about 20–50 kV. The above-mentioned test result can be utilized to simplify the process of fabricating an n-type TFT using the counter-doping. Such counter-doping can reduce the use of masks in a CMOS TFT fabrication process.

FIGS. 7A to 7D show cross-sectional views of fabricating a CMOS TFT according to the present invention. Accordingly, a coplanar CMOS TFT is fabricated by counter-doping with n-type impurities.

Figure 7A:
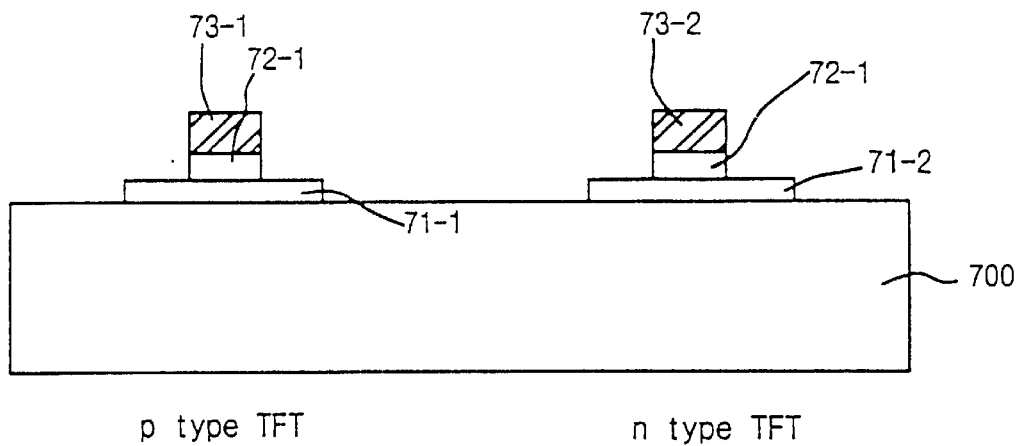
FIGS. 7A to 7D show cross-sectional views of fabricating CMOS TFT according to the present invention.

Referring to FIG. 7A, areas where an n-type TFT and a p-type TFT will be formed are defined on a substrate 700. Then, TFTs are fabricated in the respective areas by a general TFT fabrication method. Namely, first and second semiconductor layers 71-1 and 71-2 are formed on the respective areas. Semiconductor layers 71-1 and 71-2 form active layers for respective TFTs. First and second gate insulating layers 72-1 and 72-2 and first and second gate electrodes 73-1 and 73-2 are formed on the semiconductor layers 71-1 and 71-2, respectively.

Figure 7B:
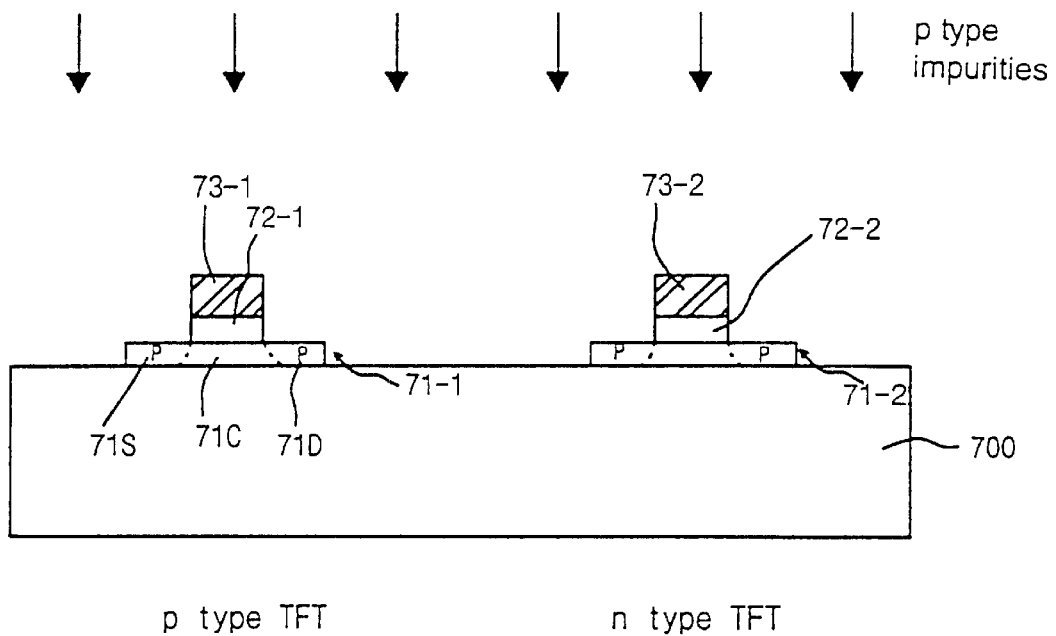

As shown in FIG. 7B, an entire top surface of the substrate is doped with p-type impurities of boron at a dose of $1 \times 10^{15}/cm^2$ and an accelerating voltage of 10 kV. In this case, the respective gate electrodes 73-1 and 73-2 work as doping masks to block the p-type impurities. As a result of the p-type impurity doping, a p-type impurity region is formed on the semiconductor layer 71-1 of a p-type TFT. Another p-type region is formed in the other semiconductor layer 71-2 of an n-type TFT. A source region 71S and a drain region 71D defined by a p-type impurity region are formed in the semiconductor layer 71-1 of the p-type TFT, thereby defining a channel region 71 C which is an undoped region. Similar regions of p-type impurity are formed in semiconductor layer 71-2 of the n-type TFT.

Figure 7C:
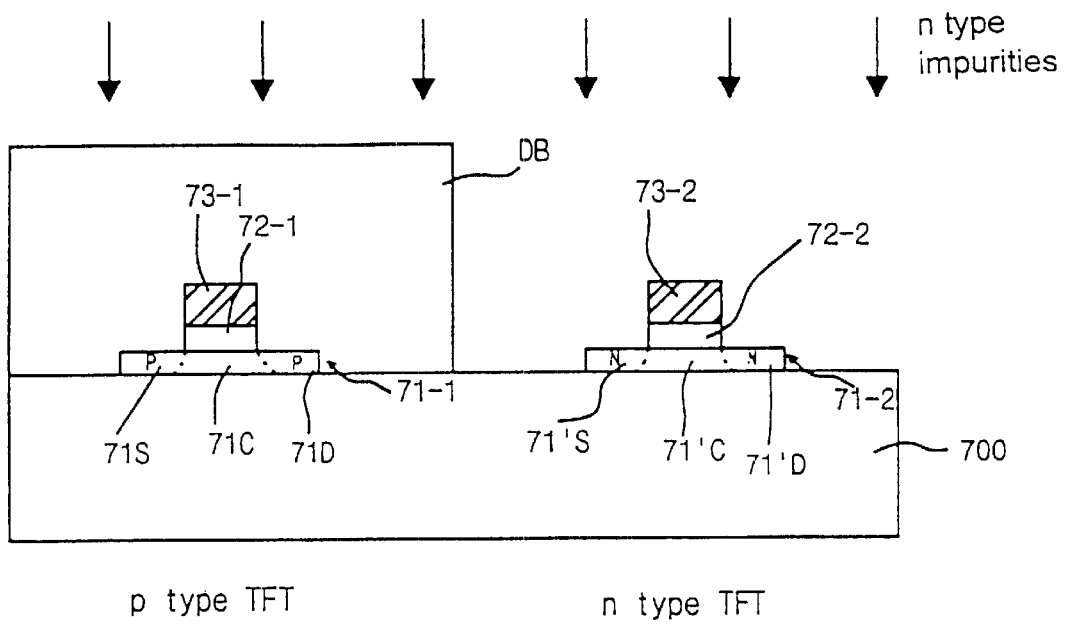

Referring to FIG. 7C, after a doping-blocking layer DB covering the p-type TFT area has been formed, counter-doping is carried out on the surface of the substrate using phosphorus as an n-type impurity. Thus, the p-type TFT region is blocked by the doping-blocking layer DB, while the semiconductor layer 71-2 of an n-type TFT is selectively doped, with the gate electrode 73-2 acting as a mask. In this case, doping conditions of n-type impurities are adjusted to compensate for the existing p-type impurities to produce n-type characteristics of an n-type TFT. For instance, the counter-doping conditions include a dose of n-type impurity of $3 \times 10^{15}/cm^2$ and an accelerating voltage of 30–50 kV. As a result, a source region 71'S and a drain region 71'D defined by an n-type impurity region are formed in the semiconductor layer 71-2 of an n-type TFT, thereby defining an undoped channel region 71'C.

Figure 7D:
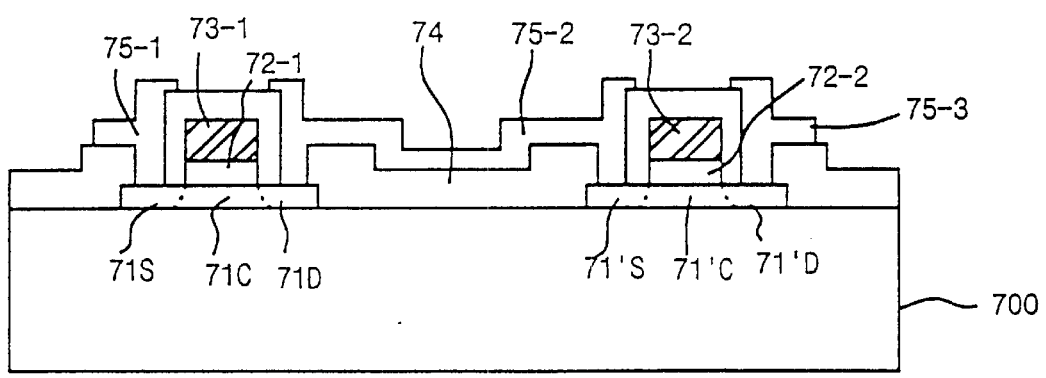

Referring to FIG. 7D, the doping-blocking layer DB covering the p-type TFT area is removed. An insulating layer 74 covering an entire top surface of the substrate 700 is formed, and contact holes are formed to expose the source and drain regions 71S and 71D of the p-type TFT. The source and drain regions 71'S and 71'D of an n-type TFT are formed, respectively. Then, a CMOS TFT constructed with p- and n-type TFTs complementary to each other is fabricated by forming wires 75-1, 75-2, and 75-3 to connect the exposed source and drain regions 71S and 71D of the p-type TFT to the exposed source and drain regions 71'S and 71'D of the n-type TFT, respectively. Accordingly, the present invention enables fabrication of CMOS TFTs by counter-doping using of a single impurity doping mask, thereby reducing the number of masks for the simplified fabrication.

In the above-described embodiment of the present invention, a CMOS TFT is fabricated by counter-doping with n-type impurities after the p-type impurity doping. Another CMOS TFT can be fabricated by doping with n-type impurities and then by counter-doping with p-type impurities using the same process steps as described above, such that two semiconductor layers are doped, a doping-blocking layer covers an n-type TFT area, and p-type impurities are implanted. The doping condition of counter-doping is established such that the respective impurities are implanted by the same accelerating voltage and such that the dose of the p-type impurities is heavier (for instance 2–3 times) than that of the n-type impurities. The same principle of the present invention, of which embodiments show test results using a coplanar TFT, can be applied regardless of the conductive type or structure of the TFT. Accordingly, the present invention provides a simplified method of fabricating a thin film transistor (TFT) by forming a CMOS TFT by counter-doping using a single impurity doping mask.

It will be apparent to those skilled in the art that various modifications and variation can be made in the method of fabricating a TFT of the present invention without departing from the spirit or scope of the invention. Thus, it is intended that the present invention encompasses modifications and variations of this invention within the scope of the appended claims and their equivalents.

What is claimed is:

1. A method of fabricating a thin film transistor, comprising the steps of:

preparing a first conductive type TFT on a substrate, the first conductive type TFT including a first semiconductor layer and a first gate electrode, and a second conductive type TFT on the substrate, the second conductive type TFT including a second semiconductor layer and a second gate electrode;

doping the first and second semiconductor layers with a first conductive type impurity using the first and second gate electrodes as a mask;

forming a doping mask covering the first conductive type TFT;

counter-doping the second semiconductor layer with a second conductive type impurity using the doping mask and the second gate electrode as masks; and forming a CMOS TFT by electrically connecting the first conductive type TFT to the second conductive type TFT;

wherein an accelerating voltage of the counter-doping step is 30–50 kV higher than an accelerating voltage of the doping step.

2. The method of fabricating a thin film transistor according to claim 1, wherein gate insulating layers and the gate electrodes form patterned doping masks wherein the semiconductor layers are doped with impurities through exposed portions of the patterned doping masks.

* * * * *